United States Patent [19]

Keeble

[11] Patent Number: 4,844,775
[45] Date of Patent: Jul. 4, 1989

[54] ION ETCHING AND CHEMICAL VAPOUR DEPOSITION

[75] Inventor: Frank Keeble, Littleton-upon-Severn, Great Britain

[73] Assignee: Christopher David Dobson, Littleton-upon-Severn, Great Britain

[21] Appl. No.: 131,850

[22] Filed: Dec. 11, 1987

[30] Foreign Application Priority Data

Dec. 11, 1986 [GB] United Kingdom ............... 8629634

[51] Int. Cl.[4] ...................... B44C 1/22; H01L 21/306; B05D 3/06; C23C 14/00
[52] U.S. Cl. .................................... 156/643; 118/728; 118/50.1; 118/620; 156/646; 156/655; 156/345; 204/192.23; 204/192.32; 204/298; 427/38
[58] Field of Search ............... 156/643, 646, 655, 656, 156/657, 345; 118/728, 50.1, 620, 621, 623; 427/38, 39; 204/192.1, 192.11, 192.12, 192.15, 192.23, 192.32, 192.34, 192.37, 298

[56] References Cited

U.S. PATENT DOCUMENTS

| 4,233,109 | 11/1980 | Nishizawa et al. | 156/345 X |
| 4,362,632 | 12/1982 | Jacob | 156/345 X |
| 4,543,465 | 9/1985 | Sakudo et al. | 156/345 X |
| 4,668,338 | 5/1987 | Maydan et al. | 156/345 X |
| 4,668,365 | 5/1987 | Foster et al. | 156/345 X |

Primary Examiner—William A. Powell
Attorney, Agent, or Firm—Young & Thompson

[57] ABSTRACT

Apparatus for use in treating semiconductor wafers or other work pieces by an active ion technique or by chemical vapour deposition, comprising a "vacuum" chamber having means for connection to an evacuating pump and to a source of the selected gas, an induction coil surrounding part of the chamber and connected to an alternating current supply to create a plasma within the chamber containing ionised elements of the gas, a support for the work piece within the chamber, and means for creating an electric field between the support and part of the chamber where the plasma exists.

6 Claims, 2 Drawing Sheets

ION ETCHING AND CHEMICAL VAPOUR DEPOSITION

This invention relates to the use of an inductively excited plasma as a large area homogeneous source of ions.

Reactive ion etching (RIE) is a dry etching technique used predominantly in semiconductor wafer fabrication. The technique is to ionise a gas or gas mixture to generate a plasma containing excited and ionised, atomic or molecular species which will react with the material to be etched. The sample, part of which is to be etched, is placed in the vicinity of or within the plasma, and it is biased in such a way that the ionidised species impact the surface to be etched. This may be accomplished by connecting the substrate to a negative potential, generally termed the bias, when the ions, which are mainly positively charged, will be attracted to the substrate. However, since the substrate is usually insulating a source of radio frequency power is commonly used, such that ions and electrons will be alternately attracted to the substrate and though in equilibrium a mean voltage is usually established, the surface continues to be bombarded so long as the R.F. power is applied.

Reactive ion etching may be accomplished using a single source of R.F. power applied to the electrode supporting the substrate with the remainder of the apparatus or a second electrode grounded. This, while being simple has the disadvantage that the bias power and the plasma intensity, hence the number of ions which are available to bombard the surface are directly related and so cannot be independently varied.

Various techniques have been used in an attempt to overcome these limitations, particularly some employing microwave power to generate the plasma. This does allow higher plasma densities and will extend the pressure range down to about $1 \times 10^{-4}$ Torr. However it is complex, expensive and somewhat difficult to shield against unwanted radiation. By contrast this invention now utilises an inductively coupled R.F. plasma generator to provide the source of ions while the substrate is biased as previously described.

Broadly stated from one aspect the present invention consists in an apparatus for use in treating semiconductor wafers or other work pieces by active ion technique or by chemical vapour deposition, comprising a "vacuum" chamber having means for connection to an evacuating pump and to a source of the selected gases, an induction coil surrounding part of the chamber and connected to an alternating current supply to create a plasma within the chamber containing the gas mixture to be ionised, a support for the work piece within the chamber, and means for creating an electric field between the support and part of the chamber where the plasma exists. Preferably the apparatus includes means for controlling or adjusting the electric field. Furthermore it also preferably includes means for controlling or adjusting the supply to the induction coil. The invention provides an independent relationship between the plasma and the electric field and the apparatus preferably includes means for adjusting or controlling independently the electric field and the electric supply to the induction coil.

The invention has three specific identified areas of application, dry etching, chemical vapour deposition and sputter deposition. The invention also consists in a method of treating a semiconductor wafer or other work piece by an active ion technique or by chemical vapour deposition in which the work piece is placed in a "vacuum" chamber which is evacuated to a low pressure, a selected gas is introduced under control, a gas plasma is created within the chamber by means of an external induction coil, the plasma intensity is controlled or adjusted by controlling the supply to the coil, and ionised particles are caused to move onto the work piece by creating an electric field within the chamber between the plasma zone and the work piece.

Inductively excited plasmas have a number of features which are advantageous in this application:

1. The coil which induces the plasma may be outside the vacuum environment if desired so avoiding any contamination of the plasma.
2. The ion density within the plasma is uniform over a large fraction of the excitation coil diameter.
3. The inductive excitation is power efficient by virtue of the inherent electron trapping mechanism.
4. Also due to the trapping, plasma excitation at pressures as low as 0.001 Pa ($10^{-5}$ Torr) is possible.
5. Also due to the trapping, high ion densities in the region of $10^{17}$ per $M^3$ are possible at low pressures.
6. The plasma produced is at low energy. This is evidenced by low electron temperature and mean ion energies and the plasma potential is low.
7. The ion density is directly related to the applied r.f. excitation power, and is independent of pressure over a wide range. This allows precise control of ion density and hence ion flux extracted.
8. The inductive excitation is inherently simple to implement in practice; consequently it is reliable and comparatively inexpensive.

The invention may be performed in various ways and two embodiments will now be described by way of example with reference to the accompanying drawings, in which.

Figure 1:
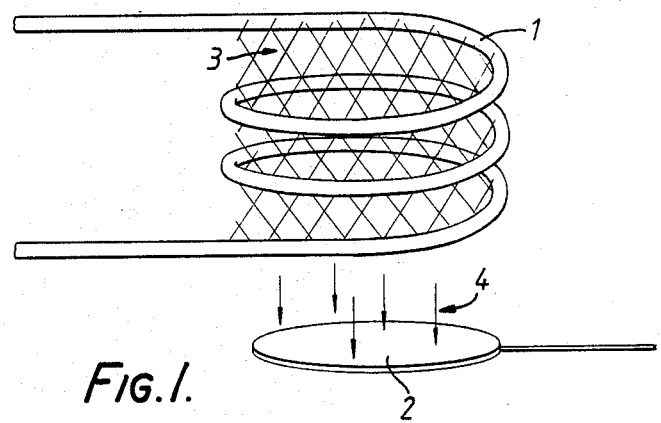
FIG. 1 is a diagram illustrating the basic principle of the invention.

FIG. 1 shows diagramatically how excitation and ion extraction is achieved. A coil 1 is fed with R.F. power, in a vacuum environment with a gas pressure of the order of 0.1 Pa ($10^{-3}$ Torr). A plasma 3 is generated, and an electrode 2 maintained at a negative potential will extract a flux of ions 4 towards the electrode.

Figure 2:
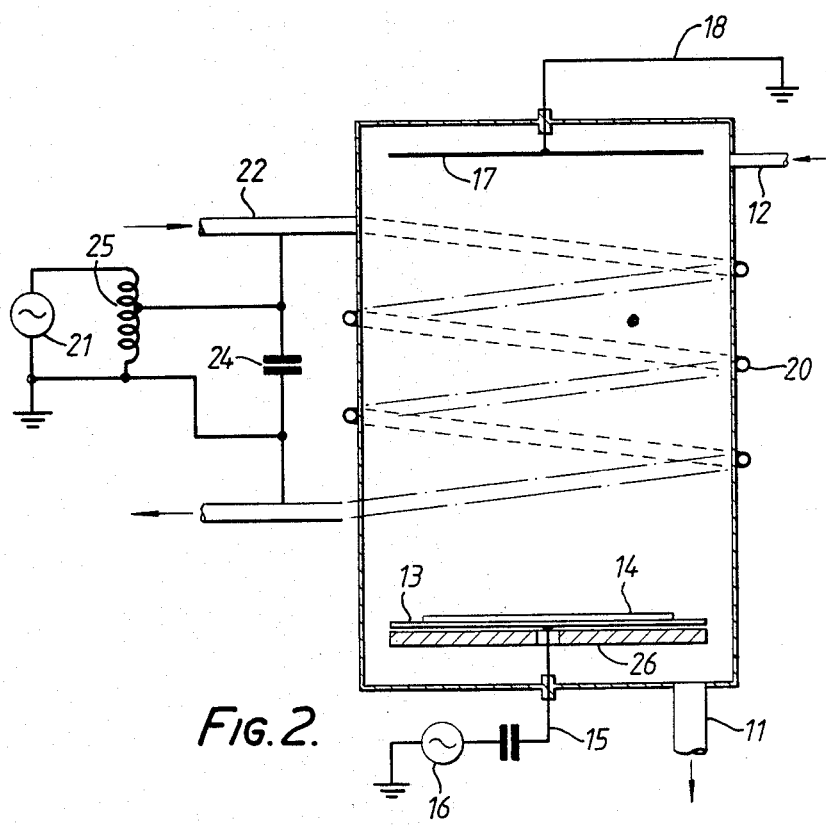
FIG. 2 is a diagramatic illustration, partly in section, of a reactive ion etching apparatus according to the invention.

In the example of FIG. 2 the apparatus comprises a "vacuum" chamber 10 having a connection 11 to a vacuum pump and a further connection 12 to a source of gas to be ionised such as carbon tetrafluoride, chlorine, or silicon tetra-chloride. The support or table 13 within the chamber positions the substrate 14 and is connected via a terminal lead 15, insulated from the chamber wall, to an external electric supply 16, the other terminal of which is earthed. At the opposite end of the chamber an opposing electrode 17 is connected by a lead 18, insulated from the chamber wall, to earth. Thus an electric field is established between the electrode 17 and the substrate support 13 and this field can be adjusted by controlling the electric supply source 16.

Surrounding the chamber wall 10 is an induction coil 20, the axis of the coil extending in the direction of the field between the electrode 17 and the support 13. The coil is connected to an external R.F. alternating current supply 21 and means may be provided for supplying a coolant through the hollow tube 22 which constitutes the coil 20. Thus a heavy R.F. current can be supplied to the coil so as to create a gas plasma in the zone 23, as a result of which ionised atomic or molecular particles are caused to move towards the work piece and make impact at high speed against the wafer to be etched.

It will be seen that the electric supply to the coil 20 can be varied as required by controlling the source 21 and this is independent of the electric field created between the electrode 17 and the support 13 under the influence of the electric supply 16. An effective, though not essential, means of powering the excitation coil 20 is to connect a capacitor 24 in parallel with the coil of such a value that a parallel resonant circuit is formed at the R.F. supply frequency. The R.F. source 21 is connected to this circuit with a transformer 25 to match the supply impendence to that of the coil and capacitor circuit. This gives efficient power transfer into the coil up to frequencies in the low megahertz range: at higher frequencies a conventional phi network is moro suitable.

Reactive ion etching may be carried out on this apparatus by introducing a reactive gas or gases while pumping to maintain a suitable pressure in the 10 to $10^{-3}$ Pa ($10^{-1}$ to $10^{-5}$ Torr) range. Examples of reactive gases are chlorine, silicon tetrachloride, boron trichloride, tetrafloromethane, trifloromethane, and oxygen. The gas(es) are selected depending upon the material to be etched and the exact results desired. the plasma is excited first at the required level, then the bias is established, again to the required level. The completion of the etch may be determined by a number of existing techniques e.g. plasma emission spectrometry, laser interferometry or mass spectrometry. In certain cases an inert gas is also introduced to modify the etch characteristics e.g. Argon, Helium, Xenon.

Sputter etching, also called ion etching, may be performed in the same apparatus and manner except that an inert gas is used and the lower part of the pressure range. A particular advantage of this apparatus in this application is that the ion energy may be kept low, i.e. less than 100 eV, but the ion flux increased so maintaining a practical etch rate without recourse to high ion energies which will damage certain samples.

Chemical vapour deposition (CVD) may be carried out in the same apparatus except that a heater 26 is generally used to raise the substrate temperature. Chemical vapour deposition consists in introducing certain gases into the chamber containing the sample to be coated and causing the gases to react to form a compound which is deposited onto the substrate. In practice most useful coatings require that the substrate be heated in order to promote the reaction or alternatively the gas be energised by means of a plasma to promote the reaction; often a combination of moderate heating and plasma activation is used. In microcircuit fabrication often the processing temperature must be limited to a level where even with plasma activation the film properties are poor. The use of low energy ion bombardment of the surface during the process will supply surface energy to greatly improve the film quality; it is important that the ion energy be kept low while the flux is adjusted to give the desired results. High energy bombardment will degrade most films. The apparatus proposed here is well suited to this type of processing.

Figure 3:
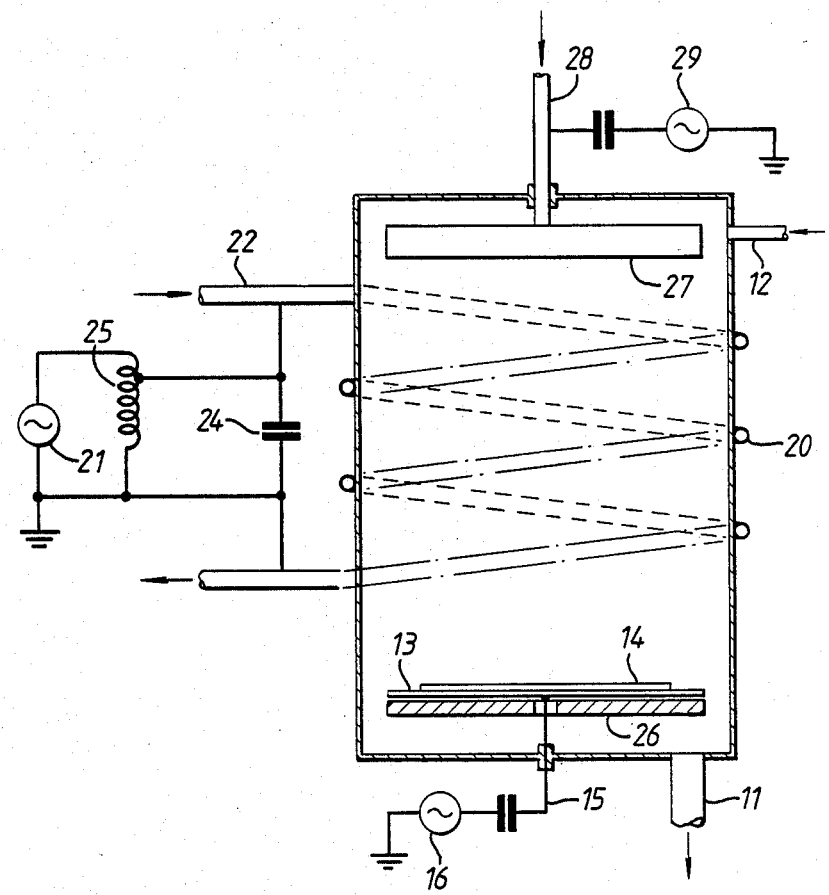
FIG. 3 is a similar diagramatic illustration of another form of apparatus according to the invention.

For sputter deposition an adaptation of the previously described apparatus is used, as shown in FIG. 3. The grounded electrode 17 is replaced by a target 27, that is a disc of the material to be sputtered, and this is connected to a fluid cooling circuit 28. The target is connected to a power supply 29 which may be d.c. if the target is made from an electrically conducting material, but must be R.F. if the target is of insulating material. The substrate 14 is positioned on the electrode 13 as before. The substrate electrode 13 may be grounded or connected to a power supply depending upon the process requirements, and a substrate heater 26 may be used as for the CVD application.

In the sputtering process an inert gas, typically Argon, is introduced into the apparatus and the excitation coil is energised. The target 27 is then biased negatively by a d.c. or r.f. source as necessary, which causes the target to be bombarded with ions and the ion energy is increased to suitable level. Typical values are 100–400 $A/m^3$ flux at energies of 200 to 600 eV. At these levels the target material will be sputtered and will deposit on the internal surfaces of the system including the substrate 14. Where the substrate electrode is connected to ground the film will be formed by neutral target atoms. In order to improve the film quality ion bombardment may be required as with CVD and this is introduced by applying R.F. power to the substrate electrode just as is done for CVD films. Some compounds can be deposited by reactive sputtering, e.g. silicon dioxide, silicon nitride, titanium nitride. This process uses an addition of the volatile component to the inert gas and in this way reforms the material on the substrate. The material sputtered is in some instances the compound, e.g. silicon dioxide and in some cases the pure metallic material, e.g. titanium. The use of substrate bias to give some ion bombardment improves the film quality for some materials.

The advantages which may be obtained by the invention include the following:
1. The inductive excitation technique does not interact with biasing system or systems used within the plasma or surrounding region except through the plasma itself. Consequently ion flux or fluxes can be extracted, their energy and density adjusted independently subject only to the plasma properties.
2. High ion current densities can be extracted at low energies, e.g. some 50 $A/m^2$ at 25 eV using some 8KW/$m^3$ of excitation power.
3. The ion current extracted is uniform over a large fraction of the coil diameter.
4. The system has a wide operating pressure range at least $10^{-3}$ to 4 Pa ($10^{-5}$ to $3 \times 10^{-2}$ Torr) and potentially larger.
5. The ion current is independent of pressure over a wide range limited at high pressure by a short electron mean free path hence scattering below the ionisation energy and at low pressure by long electron mean free path hence loss from the trapping mechanism. By adjustment of the excitation drive conditions the limits may be moved either towards lower or higher pressures for any specific application.
6. The system is inherently simple to implement and efficient in comparison with other potential techniques.
7. When using this invention a process may be started, with the plasma excited, by gradually increasing the bias from zero to the required value. Similarly on completion the bias may be turned gradually down to zero. This is not possible where the excitation and bias are provided by the same source as the plasma is only maintained above a certain power. This is most important when processing semiconductor circutis. Transient voltages are caused when switching on the bias at a high level, these can damage the thin insulating layers in the circuits rendering them useless.

8. The technique may easily be implemented under very clean conditions. The excitation coil and electrode may be outside a quartz envelope, the substrate support may be completely covered by the substrate, or may even be outside the envelope. The bias, using 13 MHz r.f. power, can be induced through a quartz wall.

The frequency range for the inductive excitation is preferably of the order of 100 KHz–13.6 MHz. Particular frequencies which are effective in practice are 220 KHz, 450 KHz, 2 MHz and 13.56 MHz.

The excitation mechanism on which the invention depends is believed to result from the fact that when a magnetic field with cylindrical symmetry acts on a low pressure gas, electrons are constrained to move in circles in planes perpendicular to the axis of symmetry of the field. Electrons with radii of gyration significantly less than the extent of the field are trapped within the field volume. In practice there are end losses but a suitable geometric configuration will minimise these. If the magnetic field is now made to oscillate the electrons will be accelerated as the field increases and their radius of gyration will decrease. Conversely they will be decelerated during periods of decreasing field. An alternating field is used in practice so there are two periods of zero field per cycle when the electrons are not trapped. However, this is the time of minimum energy so that a suitable choice of frequency and amplitude will minimise the losses during this period. Further, if the field amplitude is made sufficiently high the peak electron energy will exceed the gas ionisation energy, hence the plasma density will increase each half cycle until equilibrium is established. Since the losses are low, at equilibrium the plasma density will be high and the excitation will be effective at low pressures.

The losses which do occur are seen to be at the ends and to a lesser extent at the periphery of the field volume. The ionisation takes place predominantly where the peak field strength is highest, that is close to the excitation coils. These two effects combine to give a plasma which has radical uniformity over most of the diameter of the excitation region.

Ions can be extracted from such a plasma as a uniform flux onto an electrode biased negatively with respect to the plasma. Extraction along the axis of symmetry is generally used in order to exploit the natural uniformity across this axis. The ion flux extracted is space charge neutralised by electrons from the plasma; this is an additional advantage of the technique.

I claim:

1. An apparatus for use in treating work pieces, comprising a "vacuum" chamber having means for connection to an evacuating pump and to a source of the selected gas, an induction coil surrounding part of the chamber and connected to an alternating current supply to create a plasma within the chamber containing ionised elements of the gas, a support for the work piece within the chamber, and means for creating an electric field between the support and part of the chamber where the plasma exists.

2. An apparatus according to claim 1, including means for controlling the electric field.

3. An apparatus according to claim 1 including means for controlling or adjusting the electric supply to the induction coil.

4. An invention as in claim 1 including means for controlling independently the electric field and the electric supply to the induction coil.

5. A method of treating work piece in which the work piece is placed in a "vacuum" chamber which is evacuated to a low pressure, a selected gas is introduced under control, a gas plasma is created within the chamber by means of an external induction coil, the plasma intensity is controlled by controlling the supply to the coil, and ionised particles are caused to move onto the work piece by creating an electric field within the chamber between the plasma zone and the work piece.

6. A method according to claim 5, in which the electric field is controlled independently of the electric supply.

* * * * *